United States Patent
Wang et al.

(10) Patent No.: US 8,622,118 B2
(45) Date of Patent: Jan. 7, 2014

(54) LOOP HEAT PIPE

(75) Inventors: De-Yu Wang, Shenzhen (CN); Chao Xu, Shenzhen (CN); Jiang-Jun Hu, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 577 days.

(21) Appl. No.: 12/916,606

(22) Filed: Oct. 31, 2010

(65) Prior Publication Data
US 2012/0043060 A1     Feb. 23, 2012

(30) Foreign Application Priority Data
Aug. 20, 2010   (CN) .......................... 2010 1 0258658

(51) Int. Cl.
*F28D 15/00* (2006.01)
*H05K 7/20* (2006.01)

(52) U.S. Cl.
USPC ................. 165/104.26; 165/104.21; 361/700

(58) Field of Classification Search
USPC ....................................... 165/104.26, 104.21
See application file for complete search history.

(56) References Cited

U.S. PATENT DOCUMENTS

| 4,883,116 | A | * | 11/1989 | Seidenberg et al. | 165/104.26 |
|---|---|---|---|---|---|
| 5,725,049 | A | * | 3/1998 | Swanson et al. | 165/104.26 |
| 6,330,907 | B1 | * | 12/2001 | Ogushi et al. | 165/104.26 |
| 7,013,956 | B2 | * | 3/2006 | Thayer et al. | 165/104.25 |
| 2003/0178184 | A1 | * | 9/2003 | Kroliczek et al. | 165/104.26 |
| 2004/0206480 | A1 | * | 10/2004 | Maydanik et al. | 165/104.26 |
| 2007/0012427 | A1 | * | 1/2007 | Liu et al. | 165/104.26 |
| 2007/0034358 | A1 | * | 2/2007 | Lee | 165/104.26 |
| 2007/0187072 | A1 | * | 8/2007 | Chin et al. | 165/104.26 |
| 2008/0164010 | A1 | * | 7/2008 | Kang et al. | 165/104.26 |
| 2008/0277099 | A1 | * | 11/2008 | Takamatsu et al. | 165/104.26 |
| 2010/0188818 | A1 | * | 7/2010 | Li | 361/700 |

* cited by examiner

*Primary Examiner* — Allen Flanigan
*Assistant Examiner* — Jason Thompson
(74) *Attorney, Agent, or Firm* — Altis Law Group, Inc.

(57) ABSTRACT

An exemplary loop heat pipe includes an evaporator, a condenser, a vapor line and a liquid line each connecting the evaporator with the condenser to form a closed loop. A working medium is contained in the closed loop. A wick structure is received in the evaporator, and includes a bottom wall contacting the bottom plate, a support wall extending up from the bottom wall and contacting the cover plate, and guide walls extending out laterally from the support wall. The support wall separates an interior of the evaporator into a liquid chamber adjacent to the liquid line and a vapor chamber adjacent to the vapor line. The guide walls are located in the vapor chamber. Guide channels are defined between the guide walls for guiding the working medium in a vapor state to flow from the vapor chamber through the vapor line to the condenser.

16 Claims, 7 Drawing Sheets

FIG. 7

LOOP HEAT PIPE

BACKGROUND

1. Technical Field

The disclosure generally relates to heat transfer apparatuses, and particularly to a loop heat pipe with a high heat transfer efficiency.

2. Description of Related Art

Loop heat pipes are widely used in various fields for heat dissipation purposes due to their excellent heat transfer performance. A commonly used loop heat pipe includes an evaporator thermally attached to a heat-generating electronic component, a condenser, and a vapor line and a liquid line respectively interconnected between the evaporator and the condenser. A predetermined quantity of bi-phase working medium is contained in the loop heat pipe. A wick structure, lining an inner surface of the evaporator, draws condensed working medium back to the evaporator after the working medium in vaporized form has condensed at the condenser.

In operation of the loop heat pipe, the working medium conveys heat from the evaporator to the condenser. More specifically, the working medium in a liquid state contained in the wick structure of the evaporator absorbs heat from the heat-generating electronic component and vaporizes to the vapor state. The working medium in the vapor state moves through the vapor line toward the condenser, carrying heat with it. At the condenser, the working medium in the vapor state dissipates the heat to the ambient environment and condenses back to the liquid state, and then flows back to the evaporator through the liquid line to start another heat transfer cycle.

If the wick structure of the evaporator is too thick, the working medium in the liquid state contained in the wick structure of the evaporator cannot be completely vaporized in a timely manner. Therefore, part of the working medium in the liquid state mixes with the working medium in the vapor state to form a number of bubbles in and on the wick structure of the evaporator. The bubbles tend to block the pores of the wick structure of the evaporator and decrease a capillarity of the wick structure, to thereby retard the flow of the condensed working medium in the liquid state back into the evaporator. Thus, the amount of working medium in the liquid state contained in the wick structure of the evaporator is decreased, which may eventually result in overheating of the loop heat pipe.

On the other hand, if the wick structure of the evaporator is too thin, the working medium contained in the wick structure is liable to dry off altogether, whereupon the loop heat pipe is destroyed.

What is needed, therefore, is a loop heat pipe which can overcome the described limitations.

DETAILED DESCRIPTION

Reference will now be made to the drawing figures to describe the present loop heat pipe in detail.

Figure 1:
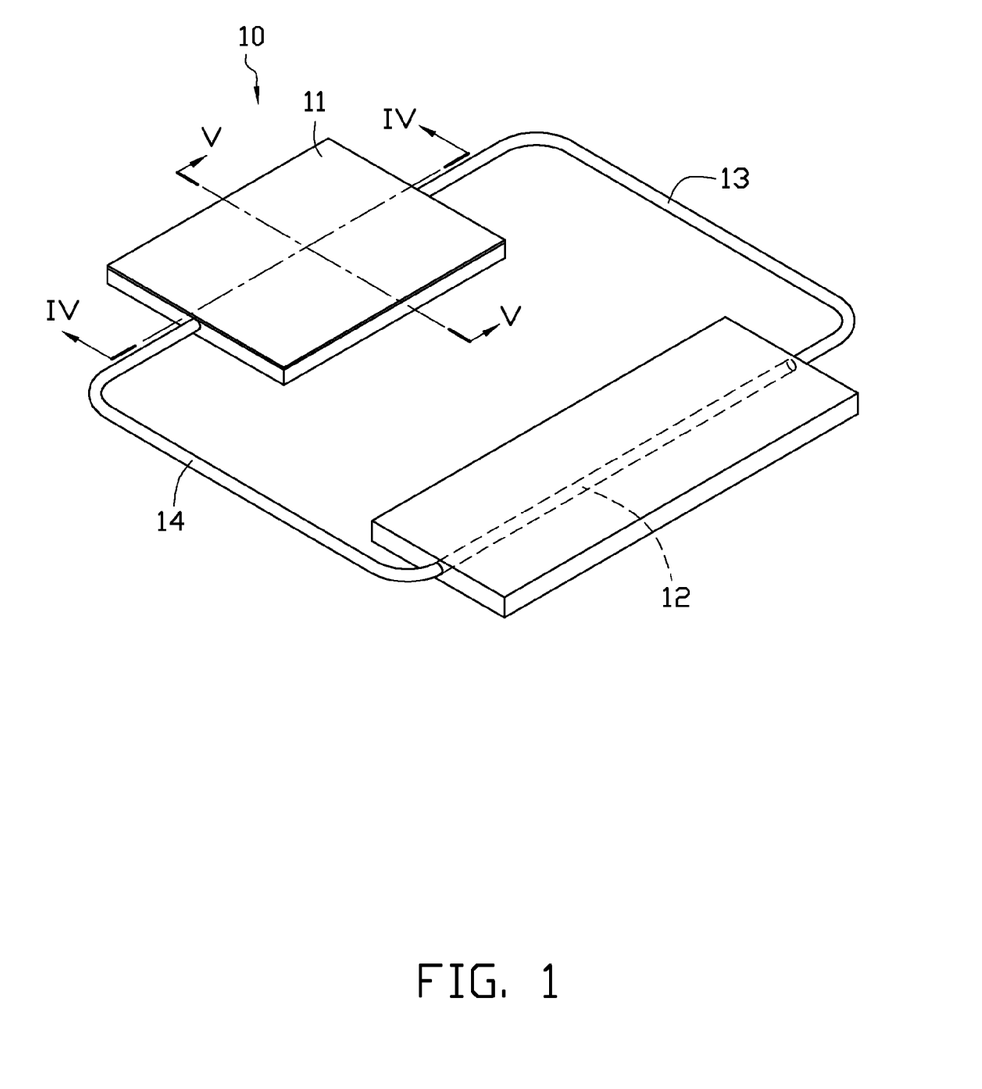
FIG. 1 is an isometric view of a loop heat pipe according to a first embodiment of the present disclosure.
Figure 2:
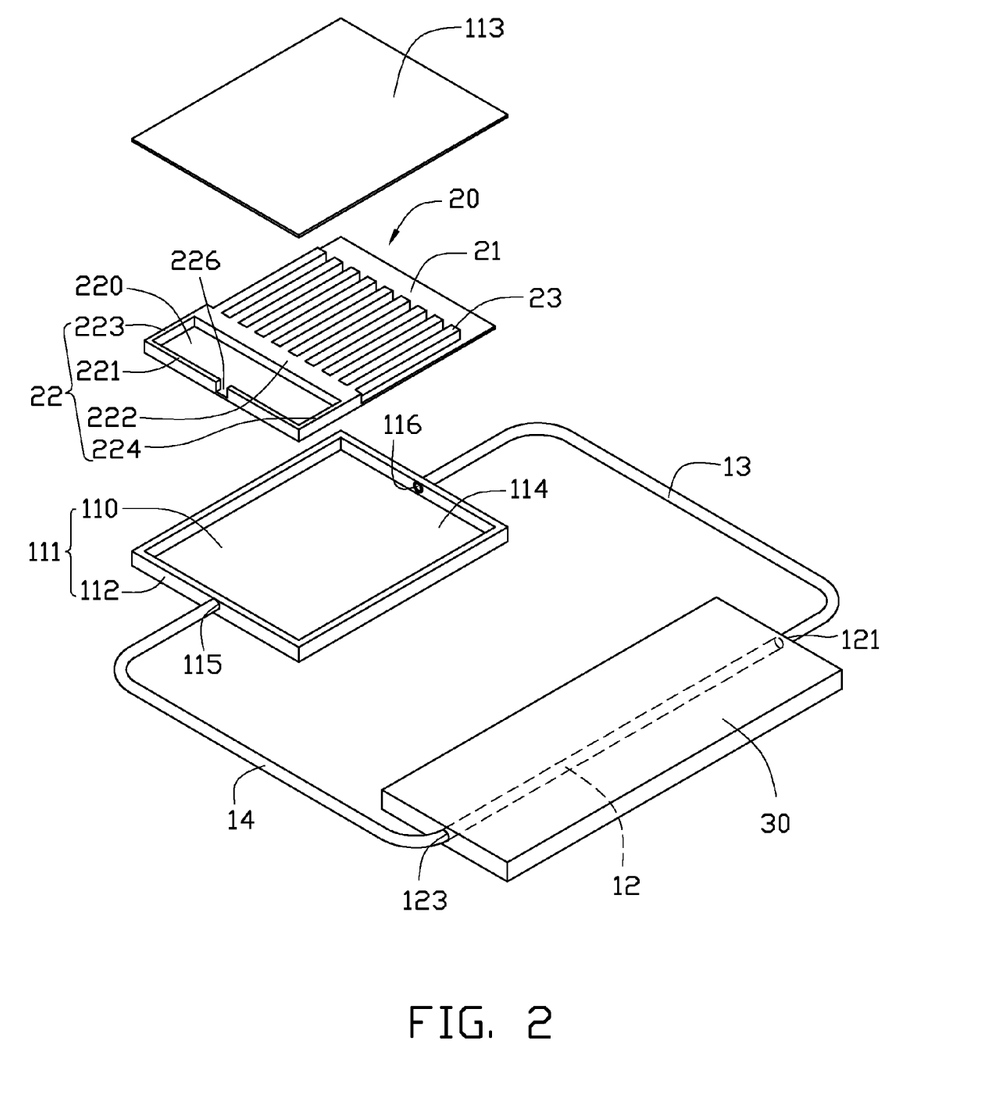
FIG. 2 is an exploded view of the loop heat pipe of FIG. 1.

Referring to FIGS. 1 and 2, a loop heat pipe 10 according to a first embodiment of the present disclosure is shown. The loop heat pipe 10 includes an evaporator 11, a condenser 12, and a vapor line 13 and a liquid line 14 connecting the evaporator 11 and the condenser 12 to form a closed loop. A predetermined quantity of bi-phase working medium (not shown) is filled in the closed loop. The working medium is a liquid which has a relatively low boiling point, such as water, methanol, or alcohol. Thus the working medium can easily evaporate when it absorbs heat transferred to the evaporator 11 from an external heat-generating object, and easily condense to liquid when it dissipates heat to the ambient environment at the condenser 12.

Figure 3:
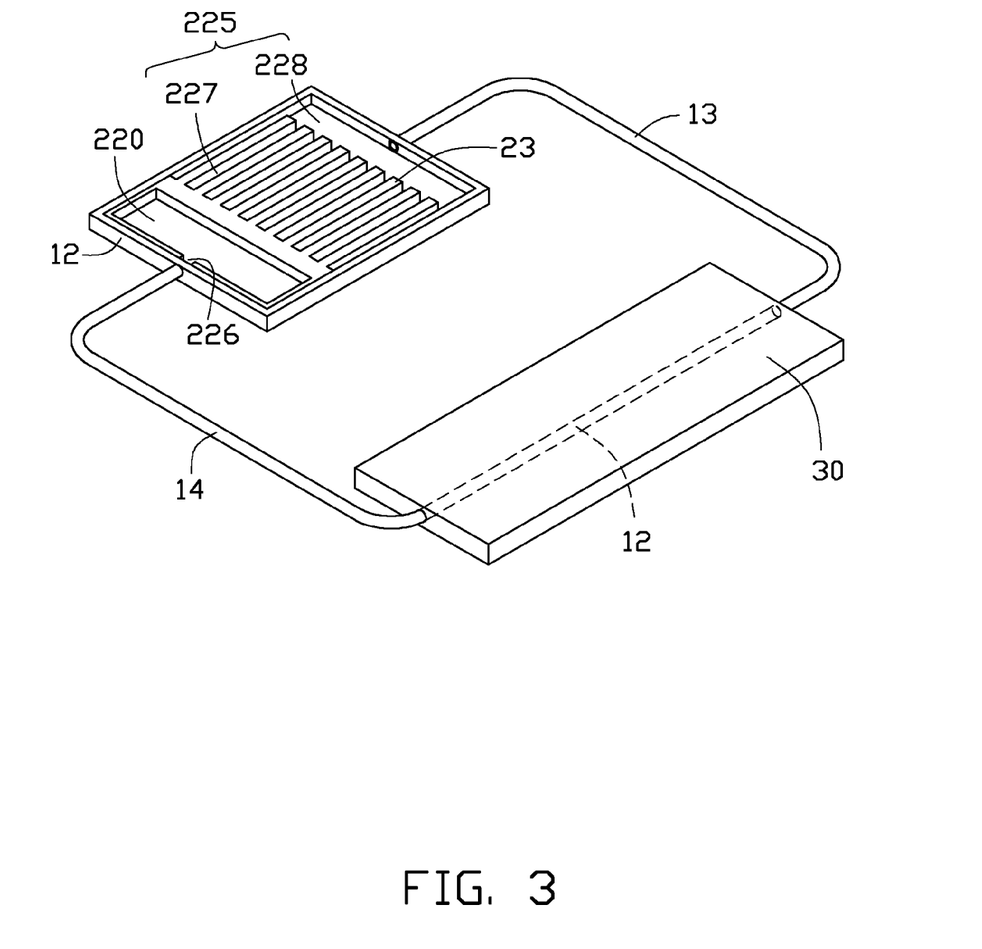
FIG. 3 is similar to FIG. 1, but with a cover plate of an evaporator of the loop heat pipe omitted.

Referring also to FIG. 3, the evaporator 11 is rectangular and has a flat shape, and includes a base 111, a wick structure 20 received in the base 111, and a cover plate 113 covering the base 111. The base 111 includes a rectangular bottom plate 110, and a side plate 112 extending up from a periphery side of the bottom plate 110. The side plate 112 surrounding the bottom plate 110 includes a left plate, a right plate, a front plate and a rear plate respectively located on the four sides of the evaporator 11. When in use, the bottom plate 110 of the evaporator 11 thermally connects to, e.g., a heat-generating electronic component 40 (see FIG. 4) to absorb the heat generated therefrom. The cover plate 113 connects to the top of the side plate 112. The bottom plate 110, the side plate 112 and the cover plate 113 cooperatively define a space 114 for receiving the wick structure 20 therein. The side plate 112 defines a circular liquid inlet 115 at the center of the left plate, and a circular vapor outlet 116 at the center of the right plate.

The wick structure 20 is made of sintered powder. The wick structure 20 includes a bottom wall 21, a four-sided support wall 22 extending up from the bottom wall 21, and a number of elongated guide walls 23 extending out from one side of the support wall 22. The size of the bottom wall 21 is substantially equal to that of the bottom plate 110 of the base 11. The support wall 22 is located at the left end of the bottom plate 110, adjacent to the liquid inlet 115. The support wall 22 includes a first wall 221, a second wall 222 substantially parallel to and spaced apart from the first wall 221, a third wall 223 adjoining left ends of the first and second walls 221, 222, and a fourth wall 224 adjoining right ends of the first and second walls 221, 222.

The first wall 221 abuts against the left plate of the side plate 112. A rectangular cutout 226 is defined at a center of the first wall 221. The cutout 226 is aligned with the liquid inlet 115 and communicates with the liquid inlet 115. The third and fourth walls 223, 224 respectively abut against the front and rear plates. The second wall 222 is located between the left and right plates, with two opposite ends of the second wall 222 abutting the front and rear plates. The second wall 222 separates an interior of the evaporator 11 into a liquid chamber 220 between the left plate and the second wall 222, and a vapor chamber 225 between the second wall 222 and the right plate, wherein the liquid chamber 220 is surrounded by the first, second, third and fourth walls 221, 222, 223, 224 of the support wall 22.

The liquid chamber 220 is located adjacent to the liquid line 14, and communicates with the liquid line 14 through the cutout 226 and the liquid inlet 115. A distance between the first and second walls 221, 222 is smaller than half of the length of the bottom plate 110. That is, a length of the liquid chamber 220 is shorter than half of the length of the evaporator 11. In this embodiment, the length of the liquid chamber 220 is about one fifth of the length of the evaporator 11. The height of the wick structure 20 is substantially equal to that of the side plate 112 of the base 11. When the wick structure 20 is received in the evaporator 11, the bottom wall 21 contacts the top surface of the bottom plate 110, and tops of the support wall 22 and the guide walls 23 contact the bottom surface of the cover plate 113.

Figure 4:
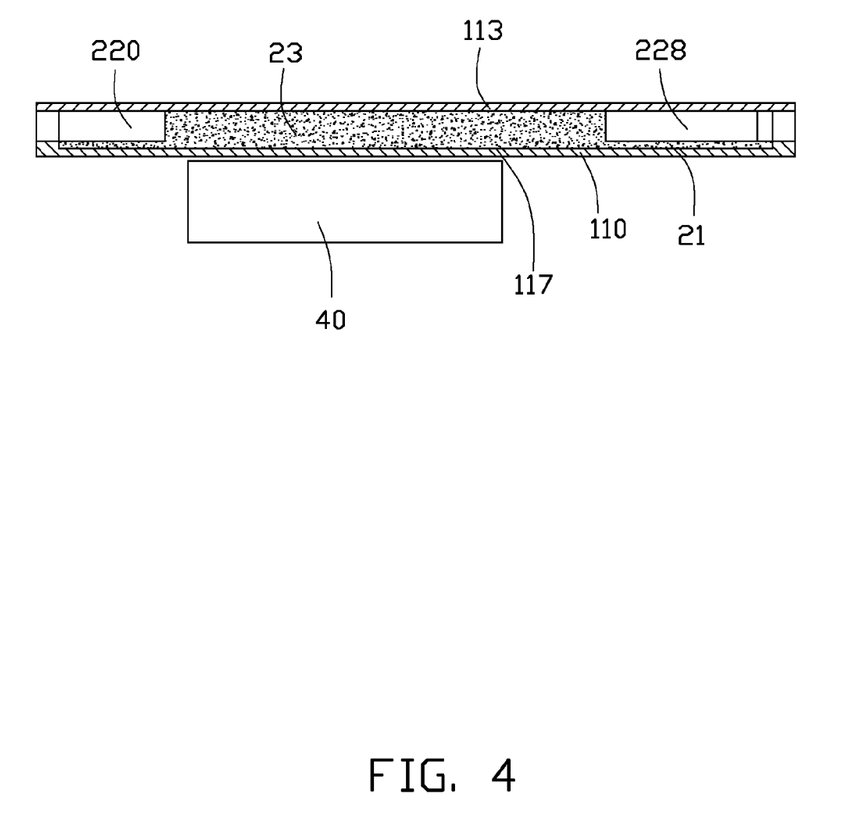
FIG. 4 is a cross section of the loop heat pipe of FIG. 1, taken along line IV-IV thereof.
Figure 5:
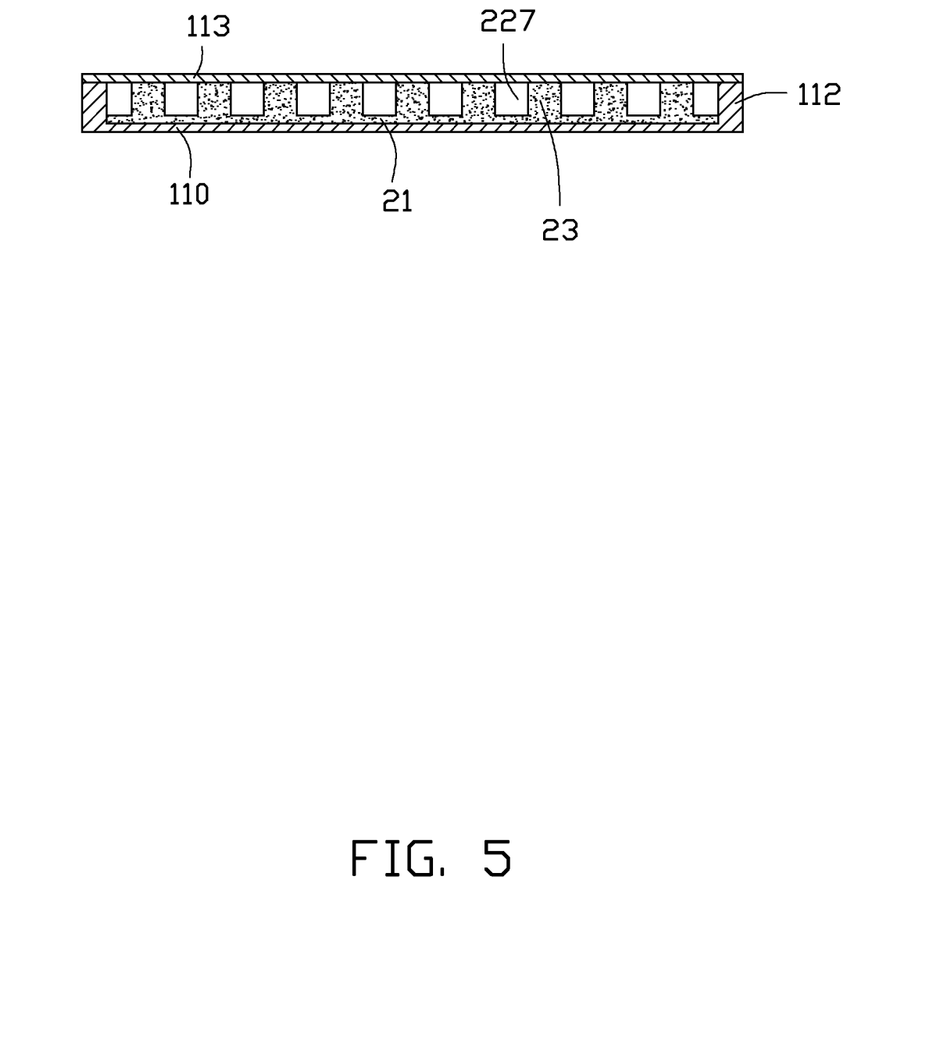
FIG. 5 is a cross section of the loop heat pipe of FIG. 1, taken along line V-V thereof.

Referring to FIGS. 4 and 5 together, the guide walls 23 are located in the vapor chamber 225 of the evaporator 11. Each of the guide walls 23 extends out from the second wall 222 at the right plate. The guide walls 23 are substantially parallel to and equally spaced from each other along the widthwise direction of the evaporator 11. An elongated rectangular guide channel 227 is defined between each two neighboring guide walls 23, and between each endmost guide wall 23 and the corresponding front or rear plate of the side plate 112. The sum of the length of the liquid chamber 220 and the group of guide walls 23 is smaller than the length of the bottom plate 21. That is, the length of each of the guide walls 23 is smaller than that of the vapor chamber 225. A room 228 communicating with each of the guide channels 227 is defined between distal ends of the guide walls 23 and the right plate of the side plate 112. In this embodiment, a transverse cross-section of each guide channel 227 is rectangular.

Each of the condenser 12, the vapor line 13 and the liquid line 14 is an elongated hollow conduit. In this embodiment, the condenser 12, the vapor line 13 and the liquid line 14 are tubes. The condenser 12 is substantially parallel to the evaporator 11, and includes a vapor inlet 121 connecting the vapor line 13 and a liquid outlet 123 connected to the liquid line 14. A heat dissipation component 30 thermally contacts an outer surface of the condenser 12 to dissipate heat to the ambient environment. The heat dissipation component 30 can be a heat sink. Although not shown, the heat dissipation component 30 can be a fin-type heat sink, which include fins for increasing the heat dissipation efficiency thereof.

During operation of the loop heat pipe 10, a portion of the bottom plate 110 which is right under the guide walls 23 of the base 111 functions as a heat-absorbing area 117 to make contact with the electronic component 40 and absorb heat generated therefrom. Thus, the working medium in a liquid state contained in the wick structure 20 absorbs heat from the electronic component and vaporizes to a vapor state. The vapor pressure expels the working medium in the vapor state, which carries heat with it, to flow along the guide channels 227 to the room 228, and then flow through the vapor line 13 to the condenser 12. The working medium in the vapor state then enters the condenser 12 through the vapor inlet 121. At the condenser 12, the working medium in the vapor state dissipates the heat to the ambient environment via the heat dissipation component 30 and condenses back to the liquid state. The working medium in the liquid state flows out of the liquid outlet 123 of the condenser 12, and is propelled through the liquid line 14 and moves into the evaporator 11 through the liquid inlet 110 thereof. The working medium in the liquid state at the evaporator 11 eventually evaporates to start another heat transfer cycle.

Due to the fact that the evaporator 11 includes the liquid chamber 220 and the vapor chamber 225, which are separated from each other, the liquid chamber 220 can maintain enough working medium in the liquid state at all times. In addition, the working medium in the liquid state contained in the liquid chamber 220 can penetrate into the wick structure 20 by capillarity of the wick structure 20, and thereby avoid overheating of the loop heat pipe 10. Furthermore, the working medium in the vapor state in the vapor chamber 225 cannot flow back to the liquid chamber 220 to mix with the working medium in the liquid state. This avoids the formation of bubbles in or on the wick structure 20, and promotes a high heat transfer efficiency of the loop heat pipe 10. Furthermore, the liquid chamber 220 and the vapor chamber 225 are horizontally arranged side by side, which advantageously minimizes a thickness of the evaporator 11. Moreover, the wick structure 20 connected between the bottom plate 110 and the cover plate 113 of the evaporator 11 can increase the mechanical strength (intensity) of the evaporator 11.

Figure 6:
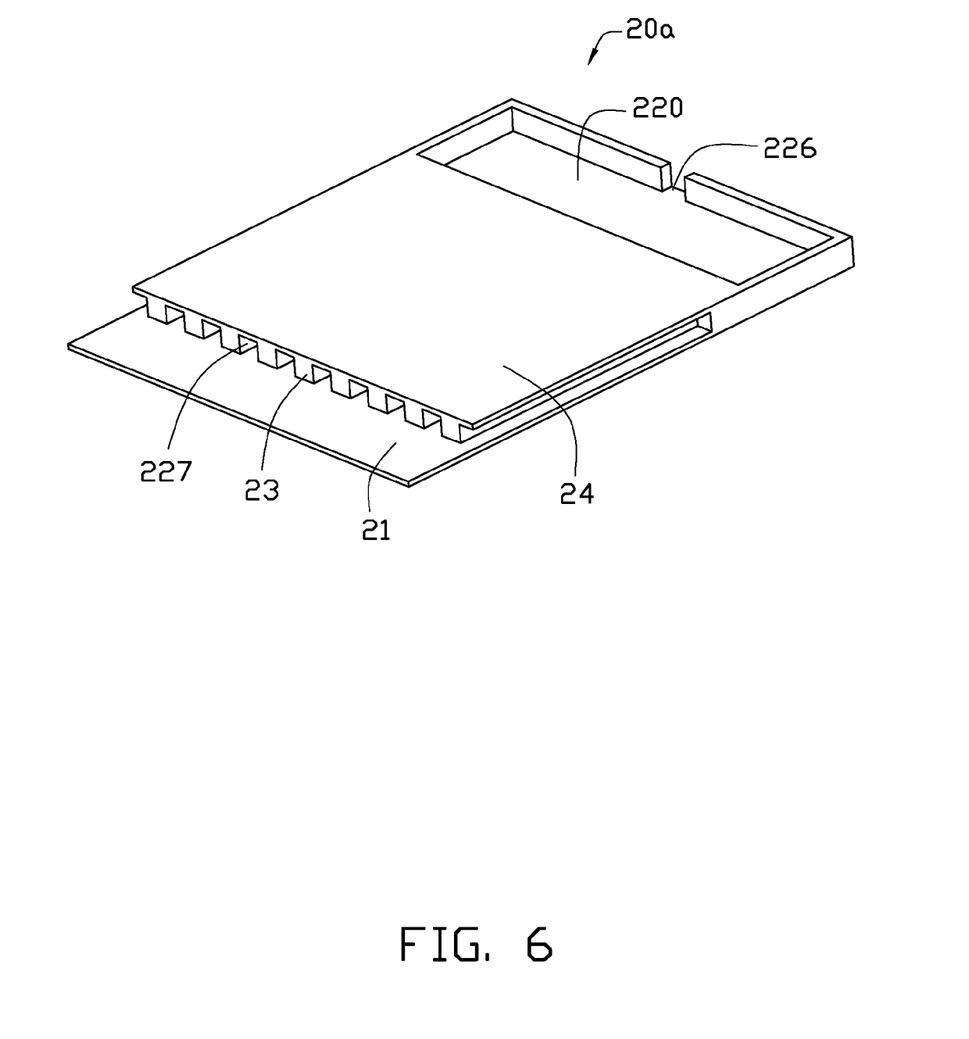
FIG. 6 is an isometric view of a wick structure of a loop heat pipe according to a second embodiment of the present disclosure.

FIG. 6 shows a wick structure 20a of a loop heat pipe according to a second embodiment. The wick structure 20a differs from the previous embodiment only in that the wick structure 20a further includes a top wall 24 located on the tops of the guide walls 23. When the wick structure 20a is received in the evaporator 11, the top wall 24 and the bottom wall 21 respectively contact the bottom surface of the cover plate 113 and the top surface of the bottom plate 110. In this embodiment, a portion of the top wall 24, which is right above the guide walls 23, can also function as a heating-absorbing area to make thermal contact with an electronic component and absorb heat generated therefrom.

Figure 7:
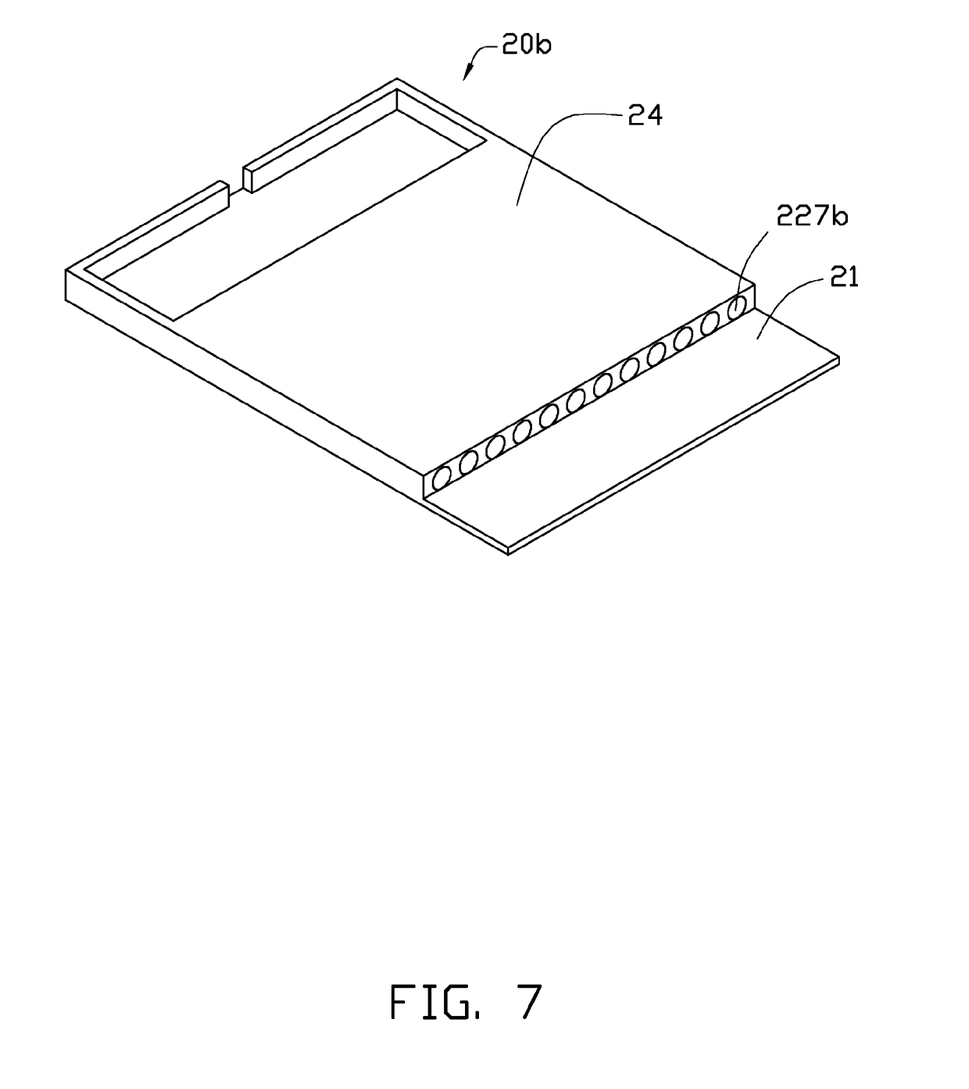
FIG. 7 is an isometric view of a wick structure of a loop heat pipe according to a third embodiment of the present disclosure.

FIG. 7 shows a wick structure 20b of a loop heat pipe according to a third embodiment. The wick structure 20b differs from the second embodiment mainly in that a transverse cross-section of each of guide channels 227b is circular. Another difference between the loop heat pipe of the third embodiment and the loop heat pipe of the second embodiment is that in the loop heat pipe of the third embodiment, there are no guide channels 227b defined between opposite lengthwise sides of the wick structure 20b and the corresponding front and rear plates of the side plate 112.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:
1. A loop heat pipe comprising:
an evaporator comprising a bottom plate, a cover plate parallel to the bottom plate, and a peripheral side plate between the bottom plate and the cover plate;
a condenser;
a vapor line and a liquid line each connecting the evaporator with the condenser, thereby forming a closed loop;
a working medium contained in the closed loop; and
a wick structure received in the evaporator, the wick structure comprising a bottom wall in contact with the bottom plate, a support wall extending up from the bottom wall and contacting the cover plate, and a plurality of guide walls extending out laterally from the support wall, the support wall separating an interior of the evaporator into a liquid chamber adjacent to the liquid line and a vapor chamber adjacent to the vapor line, the guide walls located in the vapor chamber, a plurality of guide channels defined between the guide walls for guiding the working medium in a vapor state to flow from the vapor chamber through the vapor line to the condenser;

wherein one portion of the side plate defines a liquid inlet connecting the liquid line, and another opposite portion of the side plate defines a vapor outlet connecting the vapor line, the support wall is a four-sided wall comprising a first wall, a second wall, a third wall and a fourth wall, the first, second, third and fourth walls surrounding the liquid chamber, the first wall abuts the portion of the side plate which defines the liquid inlet, and a cutout aligned with the liquid inlet is defined in the first wall, and the cutout extends substantially along the height of the first wall.

2. The loop heat pipe of claim 1, wherein the bottom plate is rectangular, the side plate comprising a left plate, a right plate, a front plate and a rear plate extending up from a periphery side of the bottom plate and surrounding the bottom plate, the liquid inlet and the vapor outlet defined in the left and right plates, respectively.

3. The loop heat pipe of claim 2, wherein the first wall abuts the left plate, the second wall is parallel to and spaced from the first wall, two opposite ends of the second wall abut the front and rear plates, respectively, and a distance between the first and second walls is smaller than half of a corresponding length of the evaporator.

4. The loop heat pipe of claim 3, wherein the distance between the first and second walls is approximately one fifth of the length of the evaporator.

5. The loop heat pipe of claim 3, wherein the guide walls extend out laterally from the second wall to a region adjacent to the right plate, thereby defining a room between distal ends of the guide walls and the right plate, the room communicating with each of the guide channels.

6. The loop heat pipe of claim 1, wherein tops of the guide walls contact the cover plate.

7. The loop heat pipe of claim 1, wherein the wick structure further comprises a top wall adjoining tops of the guide walls, and the top wall contacts the cover plate.

8. The loop heat pipe of claim 7, wherein a transverse cross-section of each of the guide channels is circular.

9. A loop heat pipe comprising:
an evaporator configured for thermally connecting with a heat generating electronic component and comprising a wick structure received therein, the evaporator further comprising a liquid inlet and a vapor outlet at two opposite sides thereof, the wick structure separating an interior of the evaporator into a liquid chamber communicated with the liquid inlet and a vapor chamber communicated with the vapor outlet;
a condenser comprising a vapor inlet and a liquid outlet at two opposite ends thereof;
a vapor line connecting the vapor outlet with the vapor inlet;
a liquid line connecting the liquid outlet with the liquid inlet, wherein the evaporator, the vapor line, the condenser, and the liquid line cooperatively form a circulatory loop; and
a working medium contained in the circulatory loop;
wherein the wick structure comprises a bottom wall and a four-sided support wall extending up from the bottom wall, and the support wall comprises a first wall, a second wall, a third wall and a fourth wall, with the first, second, third and fourth walls surrounding the liquid chamber a plurality of guide walls extending out laterally from the support wall, a cutout aligned with the liquid inlet is defined in the first wall, and the cutout extends substantially along the height of the first wall.

10. The loop heat pipe of claim 9, wherein the evaporator comprises a bottom plate, a cover plate parallel to the bottom plate, and a side plate between the bottom plate and the cover plate, the bottom wall contacts the bottom plate, and the four-sided support wall extends up from the bottom wall to connect the cover plate.

11. The loop heat pipe of claim 10, wherein the wick structure further comprises a plurality of guide walls extending out from the second wall, the guide walls are located in the vapor chamber, and a plurality of guide channels are defined between the guide walls for guiding the working medium in a vapor state to flow from the vapor chamber through the vapor line to the condenser.

12. The loop heat pipe of claim 10, wherein the side plate comprises a left plate, a right plate, a front plate and a rear plate extending up from a periphery side of the bottom plate and surrounding the bottom plate, the liquid inlet and the vapor outlet defined in the left and right plates, respectively.

13. The loop heat pipe of claim 12, wherein the first wall abuts the left plate, the second wall is parallel to and spaced from the first wall, two opposite ends of the second wall abut the front and rear plates, respectively, and a distance between the first and second walls is smaller than half of a corresponding length of the evaporator.

14. A loop heat pipe comprising:
an evaporator defining a space and having a wick structure received in the space, the wick structure separating the space into a liquid chamber and a vapor chamber horizontally arranged side by side, the evaporator further comprising a liquid inlet and a vapor outlet at two opposite sides thereof;
a condenser;
a vapor line communicating the vapor chamber of the evaporator with the condenser;
a liquid line communicating the condenser with the liquid chamber of the evaporator; and
a working medium contained in any one or more of the evaporator, the condenser, the vapor line and the liquid line;
wherein the wick structure comprises a bottom wall and a four-sided support wall extending up from the bottom wall, and the support wall comprises a first wall, a second wall, a third wall and a fourth wall, with the first, second, third and fourth walls surrounding the liquid chamber a plurality of guide walls extending out laterally from the support wall, a cutout aligned with the liquid inlet is defined in the first wall, and the cutout extends substantially along the height of the first wall.

15. The loop heat pipe of claim 14, wherein the evaporator comprises a bottom plate, a cover plate parallel to the bottom plate, and a side plate between the bottom plate and the cover plate, the bottom wall contacts the bottom plate, and the four-sided support wall extends up from the bottom wall to connect the cover plate.

16. The loop heat pipe of claim 15, wherein the wick structure further comprises a plurality of guide walls extending out from the second wall, the guide walls are located in the vapor chamber, and a plurality of guide channels are defined between the guiding walls for guiding the working medium in a vapor state to flow from the vapor chamber through the vapor line to the condenser.

* * * * *